(12) United States Patent
Minami

(10) Patent No.: US 6,376,848 B1
(45) Date of Patent: Apr. 23, 2002

(54) APPARATUS AND METHODS FOR CHARGED-PARTICLE-BEAM MICROLITHOGRAPHY EXHIBITING REDUCED ABERRATIONS CAUSED BY BEAM DEFLECTION TO CORRECT ERRORS IN STAGE-POSITION CONTROL

(75) Inventor: Hideyuki Minami, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/559,238

(22) Filed: Apr. 26, 2000

(30) Foreign Application Priority Data

May 12, 1999 (JP) .......................................... 11-130872

(51) Int. Cl.[7] ............................................. H01J 37/302
(52) U.S. Cl. ................................. 250/492.22; 250/398
(58) Field of Search ....................... 250/492.22, 492.23, 250/398

(56) References Cited

U.S. PATENT DOCUMENTS 5,260,151 A    11/1993  Berger et al.
6,087,668 A  *  7/2000  Simizu .................. 250/472.22

FOREIGN PATENT DOCUMENTS

JP        Hei 8-186070        7/1996

* cited by examiner

*Primary Examiner*—Kiet T. Nguyen
(74) *Attorney, Agent, or Firm*—Klarquist Sparkman LLP

(57) ABSTRACT

Apparatus and methods are disclosed for performing charged-particle-beam (CPB) microlithography in which aberrations arising from increased magnitudes of beam deflection are suppressed by making respective corrections for stage-position control errors. A CPB microlithography apparatus includes an image-positioning deflector that imparts a magnitude of deflection to the patterned beam appropriate for correcting stage-position-control errors. The magnitudes of correction are recorded in a memory of a statistical computer for each subfield of the pattern. Upon performing an exposure of a specified range (e.g., stripe) of the pattern containing multiple subfields, the correction values are statistically processed and trends (e.g., shifts in a specific direction) are analyzed. When exposing the next stripe of the pattern, the position of the wafer stage is adjusted in anticipation of any trends in required corrections such that the amounts of deflection to be performed by the image-positioning deflector are as small as possible within a predetermined range.

6 Claims, 6 Drawing Sheets

APPARATUS AND METHODS FOR CHARGED-PARTICLE-BEAM MICROLITHOGRAPHY EXHIBITING REDUCED ABERRATIONS CAUSED BY BEAM DEFLECTION TO CORRECT ERRORS IN STAGE-POSITION CONTROL

FIELD OF THE INVENTION

This invention pertains to microlithography in which a pattern, defined on a mask or reticle, is transferred to a suitable substrate using a charged particle beam such as an electron beam. This type of microlithography has especial utility in the fabrication of semiconductor integrated circuits and displays. More particularly, the invention pertains to suppression of aberrations arising from increased beam deflection used for correcting errors in stage-position control.

BACKGROUND OF THE INVENTION

In recent years, as semiconductor integrated circuits increasingly have become miniaturized, the resolution limits of optical microlithography (i.e., microlithography performed using ultraviolet light as an energy beam) increasingly have become apparent. As a result, considerable development effort is being expended to develop microlithography apparatus and methods that employ an alternative type of energy beam offering prospects of better resolution than optical microlithography. One candidate microlithography technology utilizes a charged particle beam, such as an electron beam or ion beam, as an energy beam. The charged particle beam passes through a charged-particle-beam (CPB)-optical system from a source (e.g., electron gun) through a reticle to a substrate (e.g., semiconductor wafer). Typically, the CPB-optical system includes an illumination-optical system that directs the beam from the source to the reticle, and a projection-optical system that directs the beam from the reticle to the wafer.

It currently is impossible to provide a CPB-optical system having an optical field large enough to expose an entire die pattern at one instant while achieving adequate control and minimization of aberrations. Hence, the pattern as defined on the reticle is typically divided into multiple small regions (subfields). Such a reticle is termed a "divided" or "segmented" reticle, in which each subfield defines a respective portion of the overall pattern. The subfields normally are illuminated one at a time and thus sequentially "transferred" onto the wafer. During transfer of the subfield images to the wafer, the wafer is mounted on and appropriately moved by a wafer stage to accurately place the subfield images on the wafer. As projected on the wafer, the respective images of the illuminated subfields desirably are arranged so as to be connected ("stitched") together in the proper order and arrangement so as to form the entire pattern on the wafer after completing exposure of all the subfields of the reticle. General aspects of this "divided-reticle pattern-transfer" technology are described, for example, in U.S. Pat. No. 5,260,151 and in Japanese Kôkai patent document no. Hei 8-186070.

In divided-reticle pattern transfer, to ensure accurate transfer of the pattern portion defined by a reticle subfield to the wafer, the image of the subfield must fall accurately within the respective target region on the wafer. Conventionally, the wafer is mounted on a wafer stage, and wafer-stage position is measured using a laser interferometer that can measure stage position very accurately. In actual practice, however, errors occur in the actual wafer-stage position. For example, a positional error can be 1 μm in one or both of the X- and Y-directions. Conventionally, such errors are conventionally corrected using a deflector configured to impart a compensating deflection to the beam. This operation normally is repeated for each transfer of a subfield.

Unfortunately, the conventional remedies summarized above result in the positions on the wafer of the projected subfield images being shifted from their respective calibrated positions. Also, use of a deflector results in the beam being consistently laterally shifted from the ideal central coordinates of the projection-optical system, and an overall increase in aberration due to deflecting the beam.

SUMMARY OF THE INVENTION

In view of the shortcomings of conventional practice as summarized above, an object of the invention is to provide charged-particle-beam (CPB) projection-exposure apparatus and methods that adequately suppress aberrations arising from shifts of beam position from an "ideal" (or "target") deflection position (at which a subfield image would be accurately transferred by the projection-optical system) due to errors in stage-position control.

To such end, and according to a first aspect of the invention, CPB microlithography apparatus are provided. In a representative embodiment of such an apparatus, an illumination-optical system is situated and configured to illuminate a charged-particle illumination beam from a source onto a reticle defining a pattern to be transferred onto a sensitive substrate. The reticle is divided into multiple subfields each defining a respective portion of the pattern and each being individually illuminated by the illumination-optical system for transfer of the respective pattern portion (the illumination beam passing through the illuminated subfield forms a patterned beam propagating downstream of the reticle). The apparatus also comprises a reticle stage on which the reticle is movably mounted to allow the illumination-optical system to illuminate a region of the reticle with the illumination beam. The position of the reticle stage is detected using a reticle-stage position detector. The apparatus also comprises a projection-optical system situated and configured to project and focus the patterned beam onto a sensitive substrate. The projection-optical system comprises an image-positioning deflector. The substrate is movably mounted on a substrate stage to allow the patterned beam, passing through the projection-optical system, to form an image of the illuminated subfield at a respective location on the sensitive substrate. The position of the substrate stage is detected using a substrate-stage position detector. The apparatus also comprises a controller connected to the illumination-optical system, the projection-optical system, the reticle stage, the reticle-stage position detector, the substrate stage, and the substrate-stage position detector.

The controller is configured to perform several functions, as follows: (1) controllably operate each of the projection-optical system, the reticle stage, the reticle-stage position detector, the substrate stage, and the substrate-stage position detector, so as to transfer the pattern subfield-by-subfield in a sequential manner from the reticle to the substrate; (2) controllably energize the image-positioning deflector so as to arrange the images of the subfields contiguously on the substrate; (3) detect errors in positioning of one or both the reticle stage and substrate stage for exposing an image of a subfield on the substrate; (4) correct the stage-positioning errors for subfields in a range of subfields by appropriately energizing the image-positioning deflector; (5) in a memory, store data concerning the stage-positioning errors detected in the range; (6) calculate an error statistic concerning stage-positioning errors detected regarding the subfields in the range, so as to yield data concerning an error trend in the range; and (v7) during exposure of a subsequent range of subfields, recalling the data from the memory and utilizing the recalled data and the data concerning the error trend in a previous range to control positioning of the stages during exposure of the subfields in the subsequent range so as to minimize average errors in stage positioning in the subsequent range. The data stored in the memory can include data on image rotation detected for the subfields in the range. The statistic can be, for example, a sum of squares of effective errors detected for the subfields in the range.

The controller desirably directs operation of the image-positioning deflector so as to achieve, in each range, a deflection of the patterned beam sufficient to reduce deflection aberrations compared to deflection aberrations obtained during exposure of subfields in a previous range.

Also desirably, the subfields on the reticle are arranged into a plurality of stripes each comprising multiple rows of subfields, wherein each stripe constitutes a range.

According to another aspect of the invention, methods are provided for performing CPB microlithography in which a charged-particle illumination beam sequentially irradiates subfields of a segmented pattern-defining reticle, and a patterned beam, formed from the illumination beam passing through an illuminated subfield, is directed to a corresponding location on a sensitive substrate. Specifically, the methods achieve control of deflection-induced aberrations of the patterned beam. In a representative embodiment of such a method, the reticle is mounted on a reticle stage that moves the reticle as required to allow the illumination beam to illuminate a desired subfield of the reticle. Similarly, the substrate is mounted on a substrate stage that moves the substrate as required to allow the patterned beam to form an image of the illuminated subfield at a desired location on the substrate. Respective positions of the reticle stage and substrate stage are detected. An image-positioning deflector is provided that is operable to deflect the patterned beam as required to form the image of the illuminated subfield at a desired location on the substrate. While transferring the pattern from the reticle to the substrate, errors in positioning of one or both the reticle stage and substrate stage for exposing an image of a subfield on the substrate are detected. The stage-positioning errors are corrected for subfields in a range of subfields by appropriately energizing the image-positioning deflector. Data concerning the stage-positioning errors detected in the range are stored. An error statistic is calculated concerning stage-positioning errors detected regarding the subfields in the range, so as to yield data concerning an error trend in the range. During exposure of a subsequent range of subfields, the data are recalled from storage and utilized (along with the data concerning the error trend in a previous range) to control positioning of the stages during exposure of the subfields in the subsequent range so as to minimize average errors in stage positioning in the subsequent range.

Hence, the beam deflections required to adjust subfield-image positions sufficiently to correct for errors in stage-position control are stored for each subfield in a range (e.g., a stripe). The beam-correction deflections are statistically processed and any trends (e.g., stage-positional shifts in a specific direction) are analyzed. When exposing the next specific range (e.g., the next stripe), the position of at least one stage (e.g., the substrate stage) is adjusted in anticipation of the calculated trend. For example, by providing a positional offset in a specific direction, the shift from the calibrated position for the respective stage can be minimized, thereby reducing deflection-induced aberrations.

The foregoing and additional features and advantages of the invention will be more readily apparent from the following detailed description, which proceeds with reference to the accompanying drawings.

BRIEF DESCRIPTION OF THE DRAWINGS

FIGS. 5(A)–5(C) schematically depict certain features of a representative embodiment of a segmented reticle as used for electronbeam microlithography, wherein FIG. 5(A) is a plan view of the overall reticle, FIG. 5(B) is a partial oblique view of the reticle, and FIG. 5(C) is a plan view of a single subfield of the reticle.

DETAILED DESCRIPTION

Figure 4:
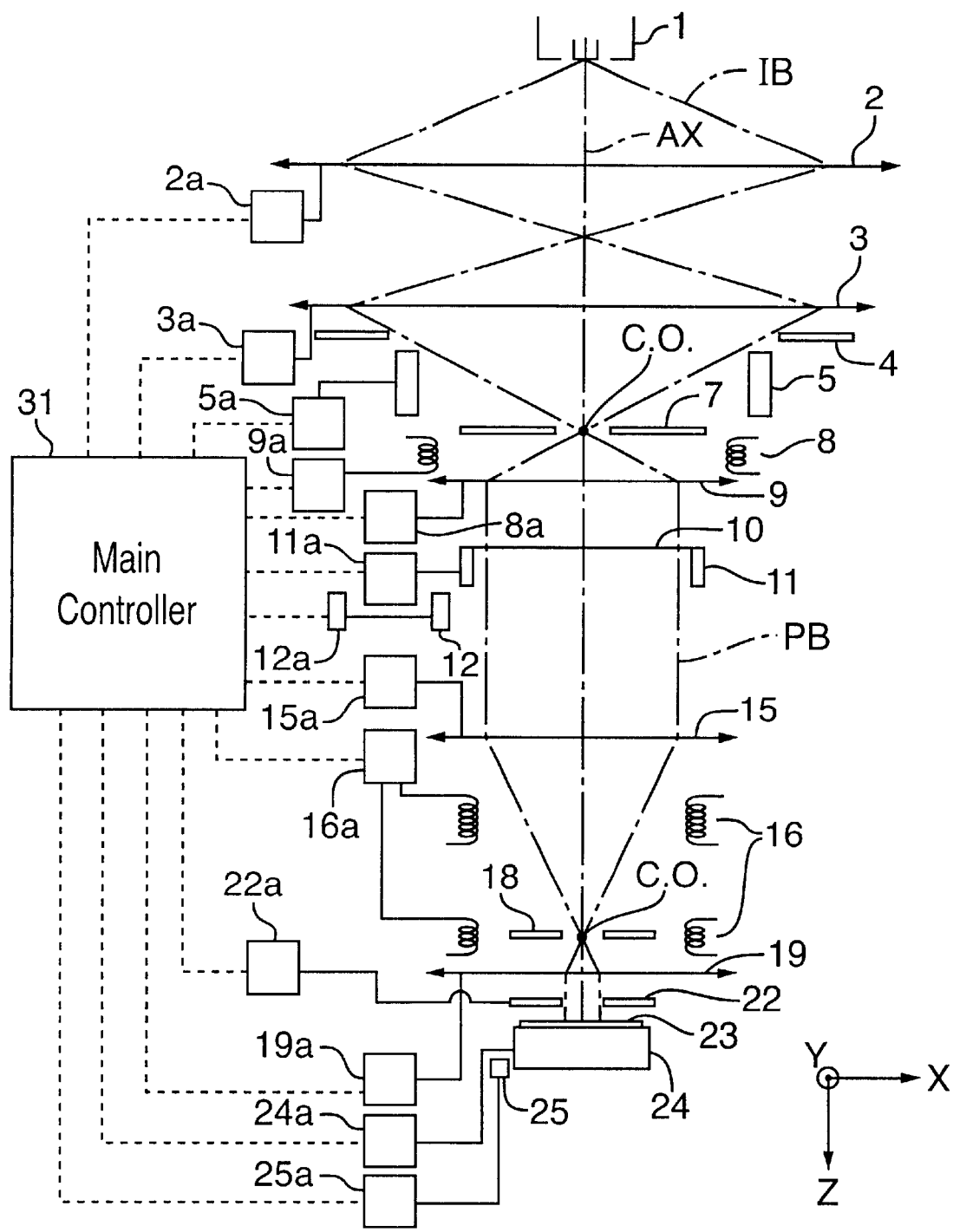
FIG. 4 is a schematic elevational view of various components, imaging relationships, and control systems of an electron-beam microlithography apparatus according to a representative embodiment of the invention.

Reference is first made to FIG. 4 that depicts an overall configuration of a representative embodiment of a charged-particle-beam (CPB) microlithography apparatus according to the invention. FIG. 4 also depicts certain imaging and control relationships of the CPB optical system of the apparatus. FIG. 4 is depicted and discussed in the context of an electron-beam system. However, it readily will be understood that the general principles discussed below can be applied with equal facility to an ion-beam system or the like.

An electron gun 1 is situated at the extreme upstream end of the optical system of FIG. 4. The electron gun 1 emits an electron beam (termed the "illumination beam" IB) in a downstream direction (downward in the figure) along an optical axis AX. A two-stage condenser-lens assembly (comprising first and second condenser lenses 2, 3, respectively) is situated downstream of the electron gun 1. The illumination beam passes through the condenser lenses 2, 3 and forms a crossover image C. O. at a blanking aperture 7.

A beam-shaping aperture 4 is situated downstream of the second condenser lens 3. The beam-shaping aperture 4 has a transverse profile (usually square or rectangular) that trims and shapes the illumination beam IB to have a transverse profile and dimensions sufficient to illuminate only one "subfield" on a downstream reticle 10. A "subfield" is a unit of the reticle pattern that is exposed at any instant of time during exposure of the pattern, and thus represents an "exposure unit" of the reticle 10. By way of example, the beam-shaping aperture 4 trims the illumination beam IB to have a square transverse profile measuring 0.5 to 5 mm on each side as illuminated on the reticle. An image of the beam-shaping aperture 4 is formed on the reticle 10 by a third condenser lens 9.

The blanking aperture 7 is defined by a plate that, except for the illumination beam IB allowed to pass through the actual blanking aperture, blocks the illumination beam. A blanking deflector 5 is situated between the beam-shaping aperture 4 and the blanking aperture 7. The blanking deflector 5 deflects the illumination beam IB to strike the plate of the blanking aperture 7 (thereby blocking the illumination beam from propagating further downstream) whenever the illumination beam is to be prevented from propagating to the reticle 10.

The optical components (lenses and deflectors) discussed above that are situated between the electron gun 1 and the reticle 10 are regarded as components of the "illumination-optical system."

A subfield-selection deflector 8 is situated downstream of the blanking aperture 7. The subfield-selection deflector 8 illuminates each subfield on the reticle 10 within the field of the illumination-optical system by sequentially or continuously scanning the illumination beam IB primarily in the left-right direction in FIG. 4 (i.e., in the X-direction). The third condenser lens 9, situated downstream of the subfield-selection deflector 8, collimates the illumination beam for impingement on the reticle. Thus, the illumination beam IB forms an image of the beam-shaping aperture 4 on the reticle 10 whenever the illumination beam strikes the reticle 10.

Even though only one subfield of the reticle 10 is shown (the depicted subfield is centered on the optical axis AX in FIG. 4), it will be understood that the reticle 10 actually comprises multiple subfields arrayed within the X-Y plane extending perpendicularly to the optical axis AX. The reticle 10 normally defines the entire pattern of, for example, a layer of a semiconductor-device chip to be transferred to a substrate ("wafer") 15. Because the reticle 10 is divided into subfields, it is termed a "divided" or "segmented" reticle.

The reticle 10 is mounted on a reticle stage 11 to facilitate mechanical movement of the reticle as required in the X- and Y-directions (perpendicular to the axis AX) during exposure of the pattern. Thus, subfields located outside the field of the illumination-optical system can be moved to within the field. The position of the reticle stage 11 in the X- and Y-directions is measured in real time by a stage-position detector 12 that employs a laser interferometer.

The FIG.-4 apparatus also comprises first and second projection lenses 15, 19, respectively, and an image-positioning deflector 16 situated downstream of the reticle 10. As the illumination beam strikes a particular subfield on the reticle 10, the portion of the illumination beam passing through the illuminated subfield and propagating downstream of the reticle 10 is denoted the "patterned beam"IB. This is because the beam downstream of the reticle is "patterned" by passage through regular pattern features and/or test-pattern features defined in the illuminated subfield and thus acquires the ability to form an image, downstream of the reticle 10, of the illuminated features. The projection lenses 15, 19 and image-positioning deflector 16 act in concert on the patterned beam PB to prepare the beam for forming the image at a desired location on the upstream-facing surface of a sensitive substrate (e.g., semiconductor wafer) 23 (termed herein the "wafer"). As the projection lenses 15, 19 converge the patterned beam PB onto the wafer 23, the image carried by the patterned beam is "reduced" (demagnified) for projection onto the wafer 23. By "reduced" or "demagnified" is meant that the image as formed on the wafer 23 is smaller (by an integer reciprocal factor termed the "demagnification ratio") than the corresponding illuminated area on the reticle 10. For each sub-field on the reticle 10, the corresponding image is formed (by the action of the image-positioning deflector 16) at a specified respective location on the wafer 23.

For imprinting of the images on the wafer surface, the upstreamfacing surface of the wafer 23 is coated with a suitable "resist." Portions of the resist that receive a dose of charged particles in the patterned beam PB undergo a latent chemical change that is "developed" to reveal the image. A wafer or substrate coated with a non-developed resist is termed "sensitive."

A second crossover C.O. is formed at an axial location at which the axial distance from the reticle 10 to the wafer 23 is divided according to the demagnification ratio. A contrast aperture 18 is located at this second crossover. The contrast aperture 18 blocks electrons of the patterned beam PB that have been scattered by passing through or by non-patterned areas of the reticle 10. Thus, such scattered electrons do not propagate to the wafer 23.

The optical components (lenses and deflectors) discussed above that are situated between the reticle 10 and the wafer 15 are regarded as components of the "projection-optical system."

A backscattered-electron (BSE) detector 22 is situated between the second projection lens 19 and the wafer 23. The BSE detector 22 detects electrons emitted when the patterned beam PB strikes the wafer 23 (which causes some of the electrons of the patterned beam to be emitted in an upstream direction from the wafer 23). For example, a beam passing through a mark pattern on the reticle 10 and scanned across a mark on the wafer 23 produces backscattered electrons. By detecting the electrons backscattered from the mark on the wafer 23, the relative positional relationship of the reticle 10 and wafer 23 can be determined. The BSE detector 22 produces an electrical signal corresponding to the backscattered electrons actually received by the detector 22. The signal is routed to a controller 31 via a converter circuit 29a. The converter circuit 29 a includes an analog-to-digital (A/D) converter that converts the signals from the BSE detector 22 to corresponding digital signals that can be processed by the controller 31.

The wafer 23 is mounted, desirably using an electrostatic chuck (not shown) or analogous device, to a wafer stage 24 that is movable in X-and Y-directions. By appropriately moving the wafer stage 24 synchronously with movements of the reticle stage 11, wide areas of the pattern as defined on the reticle 10 can be exposed sequentially onto the wafer 23. Due to the image-inversion imparted by the projection lenses 15, 19, the stage movements normally are in opposite directions relative to each other. The position of the wafer stage 24 in the X- and Y-directions is measured in real time by a stage-position detector 25 that employs a laser interferometer.

The stage-position detector 25 is connected to the controller 31 via a signal-conversion circuit 25a. Similarly, the stage-position detector 12 is connected to the controller 31 via a respective signal-conversion circuit 12a. The signal-conversion circuits 12a, 25a comprise analog-to-digital (A/D) converters, amplifiers, and other components to perform the requisite signal conversions.

The various lenses 2, 3, 9, 15, 19 and deflectors 5, 8, 16 are controlled by the controller 31 via respective coil power supplies 2a, 3a, 9a, 15a, 19a, and 5a, 8a, and 16a connected to the controller 31. In addition, the reticle stage 11 and wafer stage 24 are controlled by the controller 31 via respective stage drivers 11a and 24a connected to the controller 31. Thus, the respective positions of the stages and respective energizations of the lenses and deflectors are accurately controlled to allow demagnified images of the subfields on the reticle 10 to be stitched together accurately on the wafer 23, thereby forming one or more entire chip patterns on respective regions of the wafer.

The controller 31 is typically a microprocessor configured by software to perform the signal and data processing required to operate the CPB microlithography apparatus shown in FIG. 4. For example, the controller 31 determines control errors in positions of the reticle stage 11 and wafer stage 23 based on signals received from the respective signal-conversion circuits 12a, 25a. The controller 31 corrects such errors using the image-positioning deflector 16. Thus, a reduced (demagnified) image of an illuminated subfield on the reticle 10 can be accurately transferred to a desired target location on the wafer 23. Each of the subfield images as formed on the wafer 23 desirably is placed so as to be contiguous with ("stitched to") its neighboring subfield images. Transfer of the entire reticle pattern occurs upon transfer of all the subfields of the reticle 10 to the wafer 23. Details of correcting stage-position errors are set forth later below.

Figure 5A:
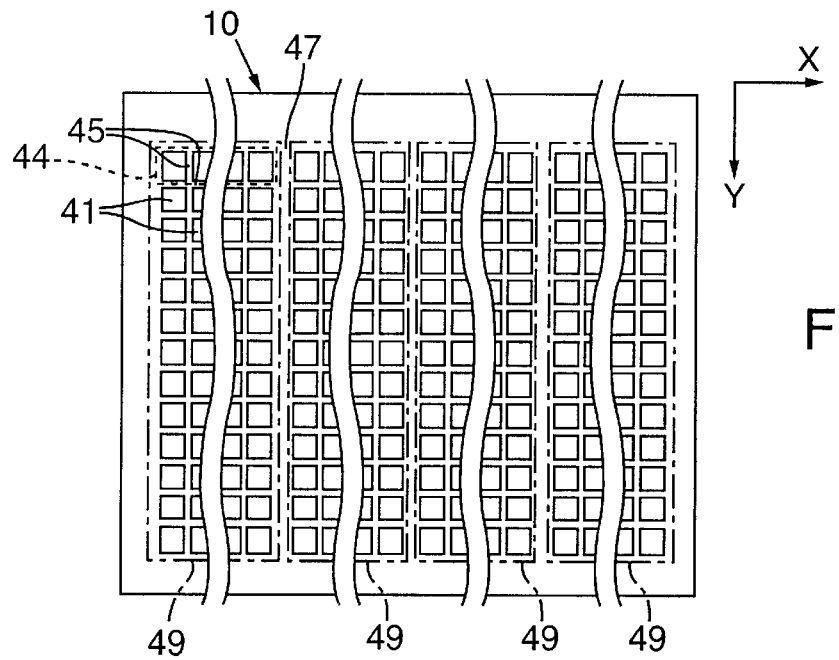
Figure 5B:
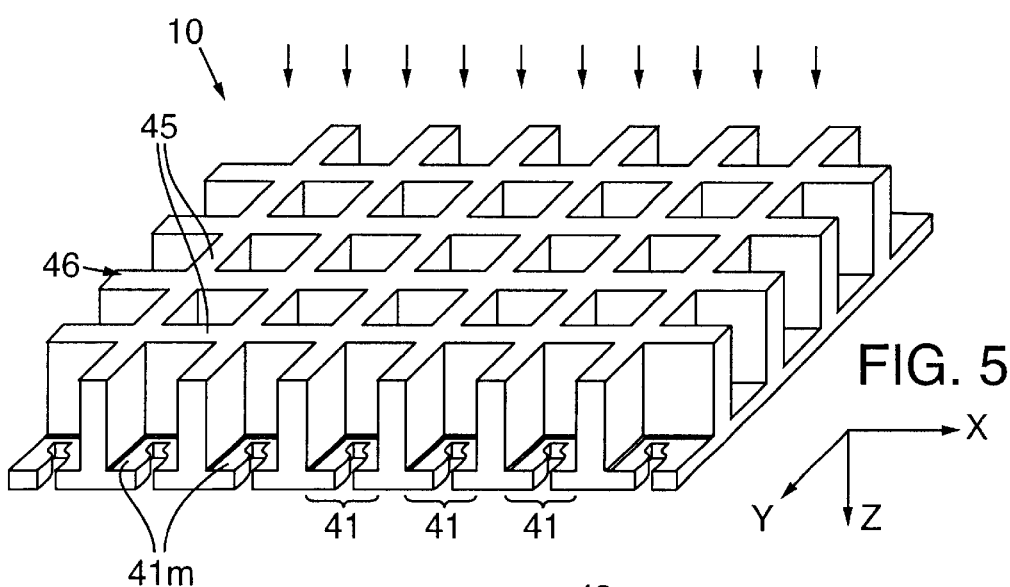
Figure 5C:
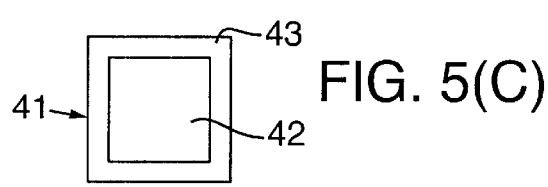

Certain details of an exemplary reticle 10 as used in the FIG.-4 apparatus are shown in FIGS. 5(A)–5(C). A reticle such as that shown in FIGS. 5(A)–5(C) can be made by, for example, electron-beam drawing or other suitable technique.

In FIG. 5(A), the reticle 10 comprises multiple "stripes" 49 each containing multiple rows of subfields 41. The rows each extend in the X-direction (representing the width dimension of the corresponding stripes), and the array of rows in each stripe 49 extends in the Y-direction (representing the length dimension of the corresponding stripe). Each row of subfields is termed a "deflection zone" 44 because the length of the row (in the X-direction) corresponds to the maximum deflection range (in the X-direction) of the illumination beam IB as achieved by the subfield-deflection deflector 8 in the illumination-optical system.

The reticle 10 can be a scattering-stencil reticle or a scattering-membrane reticle. In a scattering-stencil membrane, pattern elements are defined in part by corresponding patterns of through-holes in a reticle membrane as well as regions of the membrane between the through-holes. The membrane of a scattering-stencil reticle tends to scatter charged particles of the illumination beam, whereas the through-holes are relatively transmissive to the beam. A scattering-membrane reticle also includes a reticle membrane that, instead of scattering charged particles of an incident illumination beam IB, is relatively transmissive to the beam. Pattern elements are defined by "scattering bodies" (regions of a material that tends to scatter charged particles of an incident beam.

More specifically, as shown in FIG. 5(B), each subfield 41 comprises a respective membrane region 41 m. The thickness (Z-dimension) of each membrane region 41 m is 0.1 $\mu$m (e.g., for a scattering-membrane reticle) to several $\mu$m (e.g., for a scattering-stencil reticle). As shown in FIG. 5(C), each subfield 41 comprises a respective patterned region 42 surrounded by a skirt 43 that lacks any pattern features. The patterned region 42 defines the features of the respective portion of the overall pattern defined by the reticle 10. During illumination of a subfield 41, the respective patterned region 42 is illuminated by the illumination beam IB, wherein the edges of the illumination beam fall within the respective skirt 43.

The patterned region 42 of each subfield 41 on the reticle 10 typically has an area (extending in the X- and Y-directions) of approximately 0.5 mm to 5 mm square. At a demagnification ratio of 1/5 the size of the corresponding image of the subfield 41 as projected onto the wafer 15 is 0.1 mm to 1 mm square.

The reticle 10 includes a grid-like "grillage" 46 comprising intersecting struts 45 that surround each subfield 41 and provide the reticle with substantial rigidity and mechanical strength (the membrane regions 41 m are too thin to provide the reticle 10 with any substantial rigidity or mechanical strength). Each strut 45 is approximately 0.5 mm to 1 mm thick (in the Z-direction) and approximately 0.1 mm wide in the respective X or Y-direction.

Referring further to FIG. 5(A), multiple stripes 49 are arrayed in the X-direction on the reticle 10. Between adjacent stripes 49 and around the perimeter of the reticle 10 are wide struts 47 that provide additional rigidity to the reticle 10 (e.g., to prevent bowing and other such deformations of the reticle). A wide strut 47 situated between adjacent stripes 49 is typically several mm wide (in the X-direction) and has the same thickness (in the Z-direction) as a regular strut located between adjacent subfields 41.

Reticles can also be used in which no non-patterned regions (regular struts and skirts 43) exist between adjacent subfields 41 in each deflection field 44. i.e., in such a reticle, the patterned regions 42 of adjacent subfields 41 are contiguous within each deflection zone 44 of each stripe 49.

Using an apparatus as shown in FIG. 4 and a reticle 10 as shown in FIG. 5(A), for projection-exposure of the pattern defined on the reticle 10, the subfields 41 in each deflection zone 44 are exposed sequentially by appropriately deflecting the electron beam in the X-direction. As each deflection zone 44 is exposed, the next deflection zone 44 is moved into position for exposure by appropriately moving (in a scanning manner) the reticle stage 11 and the wafer stage 24. (The stages 11, 24 are moved in opposite directions in the Y-direction.) After completing exposure of a stripe 49, the next stripe 49 is moved into position for exposure by appropriately moving (in a start-and-stop manner) the reticle stage 11 and the wafer stage 24. (The stages 11, 24 are moved in opposite directions in the X-direction.)

As each subfield 41 is projection-exposed onto the wafer 23, the non-patterned portions (skirts 43 and struts 45) are "canceled" on the wafer so as to place the images of the patterned regions 42 contiguously with each other on the wafer 23. Such placement of the images of the patterned regions 42 on the wafer is termed "stitching" of the images. Upon completing exposure of the entire reticle 10, the corresponding image of a layer of a chip on the wafer 23 comprises all the individual images of the patterned regions 42 stitched together. At a demagnification ratio of 1/4 or 1/5, a chip size of 27 mm×44 mm on the wafer (the size of a 4-Gigabit DRAM) would require a reticle measuring (including subfields and non-patterned regions) 120 mm×150 mm to 230 mm×350 mm.

Figure 6:
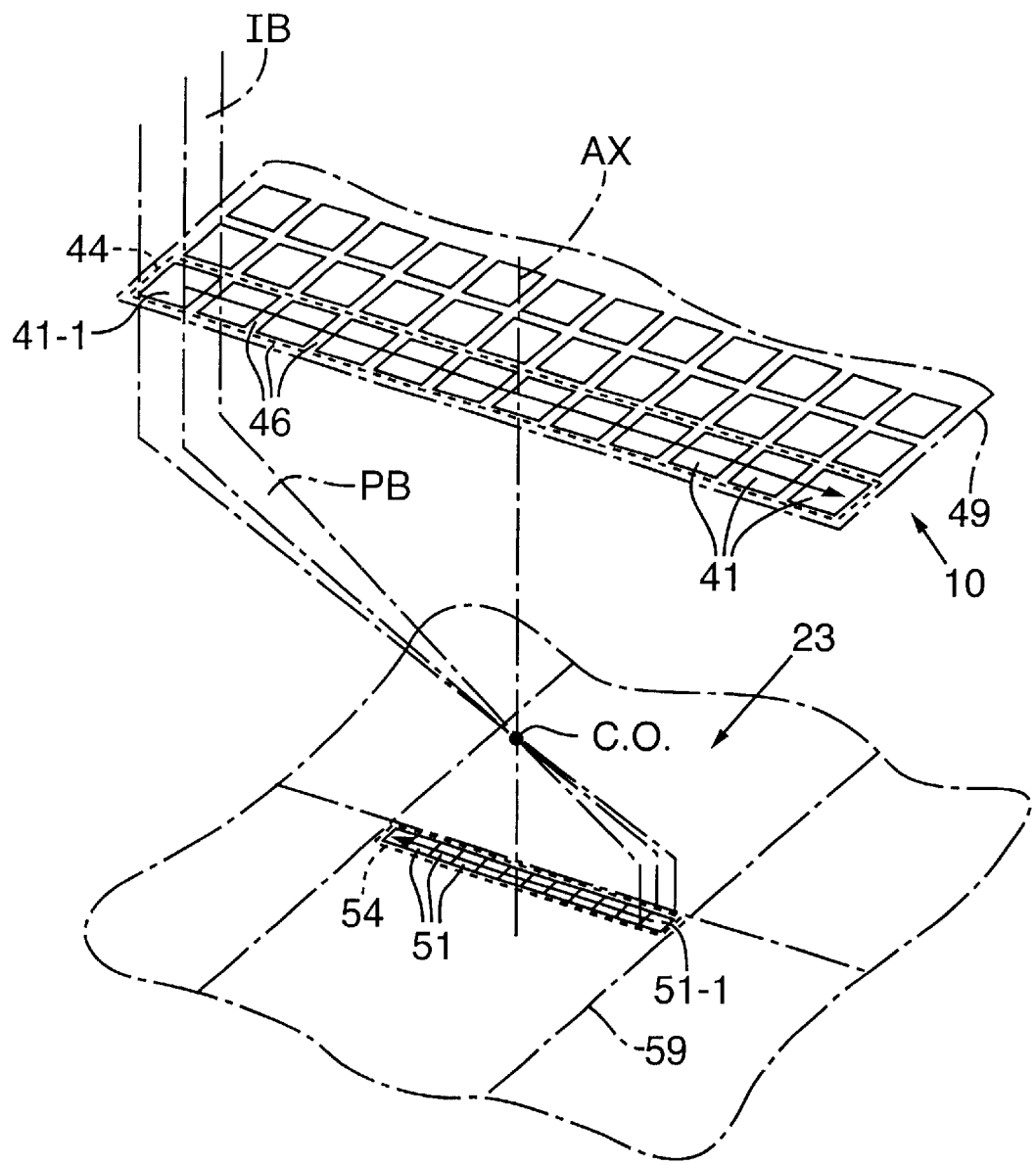
FIG. 6 is a perspective diagram schematically depicting pattern transfer from a segmented reticle to a wafer.

FIG. 6 is a perspective diagram schematically depicting the manner of pattern transfer from the reticle 10 to the wafer 23. In the upper portion of the figure, one stripe 49 on the reticle is shown. The strips 49 include multiple deflection zones 44 each containing a linear array of twelve subfields 41. The grillage 46 is also shown. In the lower portion of the figure is the wafer 23. The subfield 41-1 in the left-hand corner of the deflection zone 44 is irradiated from upstream by the illumination beam IB. The patterned beam PB that has passed through the subfield 41-1 is reduced (demagnified) and projected onto a respective "transfer region" 52-1, in a respective "deflection zone" 54 and respective stripe 59 on the wafer 23. Such imaging is performed by the concerted action of the two projection lenses 15, 19 and the image-positioning deflector 16 (FIG. 4). The projection lenses 15, 19 deflect the patterned beam PB twice. The first deflection is from a trajectory parallel to the optical axis AX to an angled trajectory allowing the beam to intersect the optical axis at the crossover C.O, and the second deflection is from the angled trajectory back to a trajectory parallel to the optical axis OX.

The locations of the subfield images 51 as projected onto the wafer 23 are adjusted to place the subfield images 52 in mutual contact with each other in the correct order and arrangement to form the complete pattern. Also, the subfield images 51 are projected onto the wafer 23 such that the skirts 43 and grillage 46 are not imaged onto the wafer. Such positioning and ordering of the subfield images 51 are achieved using the image-positioning deflector 16 (FIG. 4) functioning in concert with the first and second projection lenses 15, 19. That is, the image-positioning deflector 16 appropriately shifts the transfer positions, on the wafer 23, of the subfield images 51 so as to "stitch" them together on the wafer. To such end, the transfer positions are shifted laterally a distance equal to the width of the non-patterned regions (grillage 46 and skirts 43 ).

Although not shown in FIG. 4, a separate image-positioning deflector 16. is provided for each of the X- and Y-directions. The image-positioning deflectors 16 produce, at most, extremely small aberrations when deflecting the patterned beam to a calibrated position.

Figure 1:
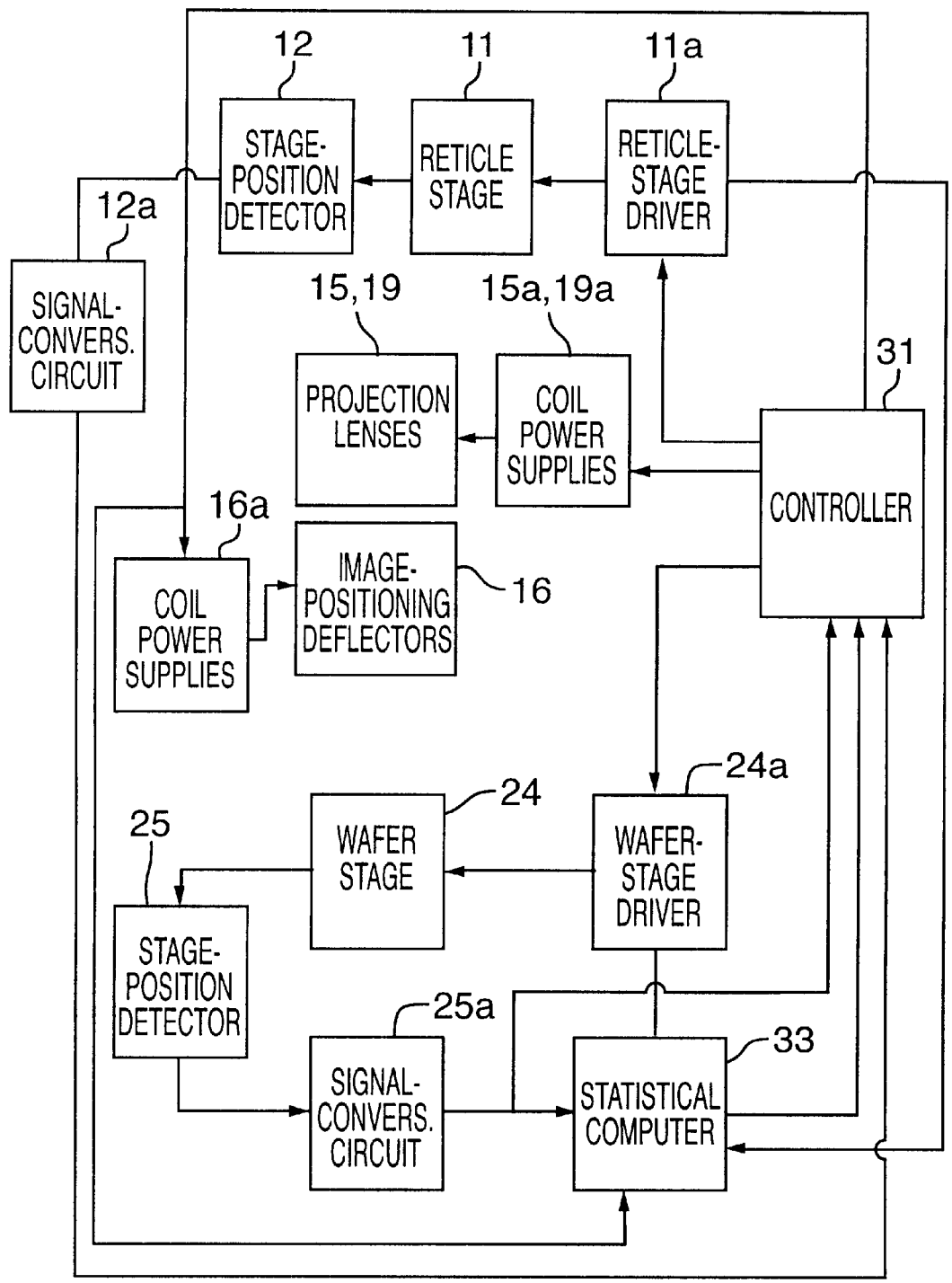
FIG. 1 is a block diagram of a configuration of an exemplary system, according to the invention, for controlling wafer-stage and reticle-stage positions as well as components of the CPB-optical system of a CPB microlithography apparatus.

A block diagram showing a representative operational scheme for the controller 31 is shown in FIG. 1. Briefly, the reticle stage 11 is driven in the X- and Y-directions by linear motors or similar means. The position of the reticle stage 11 in the X- and Y-directions is controlled by a reticle-stage driver 11 a that receives stage-position instructions from the controller 31. The position of the reticle stage 11 is detected by the stage-position detector 12. Signals from the stage-position detector 12 are routed to a statistical computer 33 and to the controller 31 via a signal-conversion circuit 12a.

The projection lenses 15, 19 are controlled by the controller 31 via respective coil power supplies 15a, 19a.

The image-positioning deflectors 16 are controlled by the controller 31 via a coil power supply 16a. The magnitude and direction of deflection imparted to the patterned beam PB by the image-positioning deflectors 16 are input to the coil power supply 16a by the statistical computer 33.

The wafer stage 24 is driven in the X- and Y-directions by linear motors or similar means. The position of the wafer stage 24 in the X- and Y-directions is controlled by a wafer-stage driver 24a that receives stage-position instructions from the controller 31. The position of the wafer stage 24 is detected by the stage-position detector 25. Signals from the stage-position detector 25 are routed to the statistical computer 33 and to the controller 31 via a signal-conversion circuit 25a.

In the following description of positional adjustments of a subfield image, it is assumed by way of example that the illumination beam IB and patterned beam PB are respective electron beams and that the subfield images 51 are formed on the wafer with substantially no rotational error, at least within a defined range.

Figure 2:
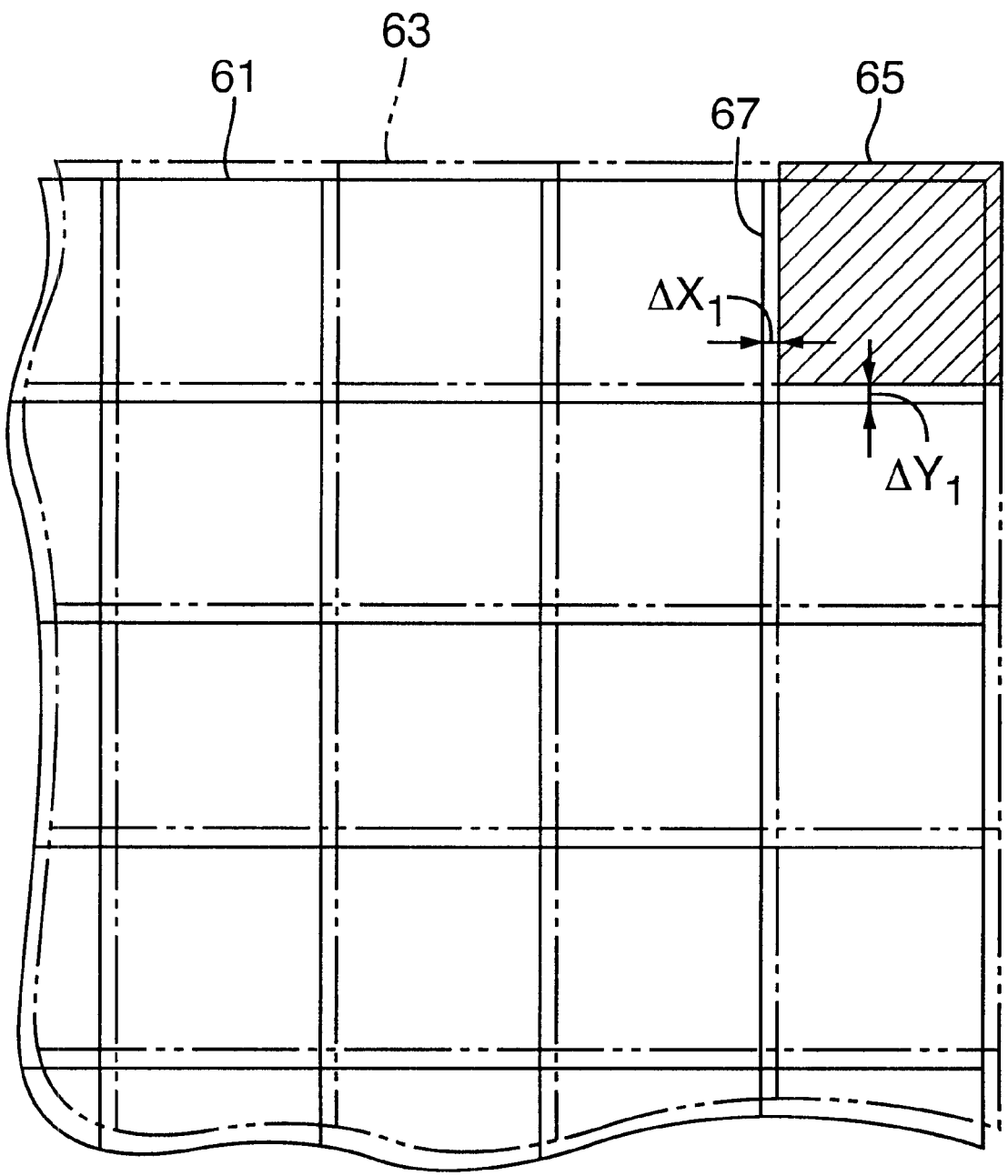
FIG. 2 is a schematic plan view of a portion of a wafer on which multiple subfield images have been exposed and depicting shifts in the respective positions of the subfield images caused by an error in stage-position control.

In FIG. 2, a region of the wafer surface is shown, including "target regions" 63 (broken lines). Each target region 63 represents a respective location on the wafer in which a respective subfield image would be placed based on respective target (ideal) positions of the reticle stage 11 and wafer stage 24. Corresponding regions 61 (solid lines) denote subfield-imaging positions based on actual stage positions as detected by the stage-position detectors. As shown, each actual region 61 is shifted relative to the respective target region 63.

For the following discussion, attention is now directed in FIG. 2 to a representative region situated in a target position 65 and the region situated in an actual position 67. If the projection-optical system were functioning so as to deflect the patterned beam based only on the corresponding target position 65 of the wafer, then the actual subfield image would be formed at the target position 65. However, due to an error in stage-position control as discussed above, the subfield image is formed, in this example, at the region 67. The image-positioning deflector 16 is actuated to shift the subfield image by amounts $\Delta X_1$, $\Delta Y_1$ so as to make the two locations 65, 67 coincident.

This positional adjustment desirably is performed as required for each subfield in a specific range 69 of subfields (e.g., a stripe). That is, if the actual wafer-stage position is displaced from a corresponding target wafer-stage position due to a stage-control error and/or other cause, by shifting the image position of the patterned beam using the deflector 16, the displacement is corrected. With respect to the magnitude of the displacement correction, the position of the subfield image 65 can be shifted a distance on the wafer equal to the reticle-stage position error multiplied by the demagnification ratio of the projection-optical system. The result of such a calculation is included in determining the compensatory adjustments to be made by the image-positioning deflector 16.

Figure 3:
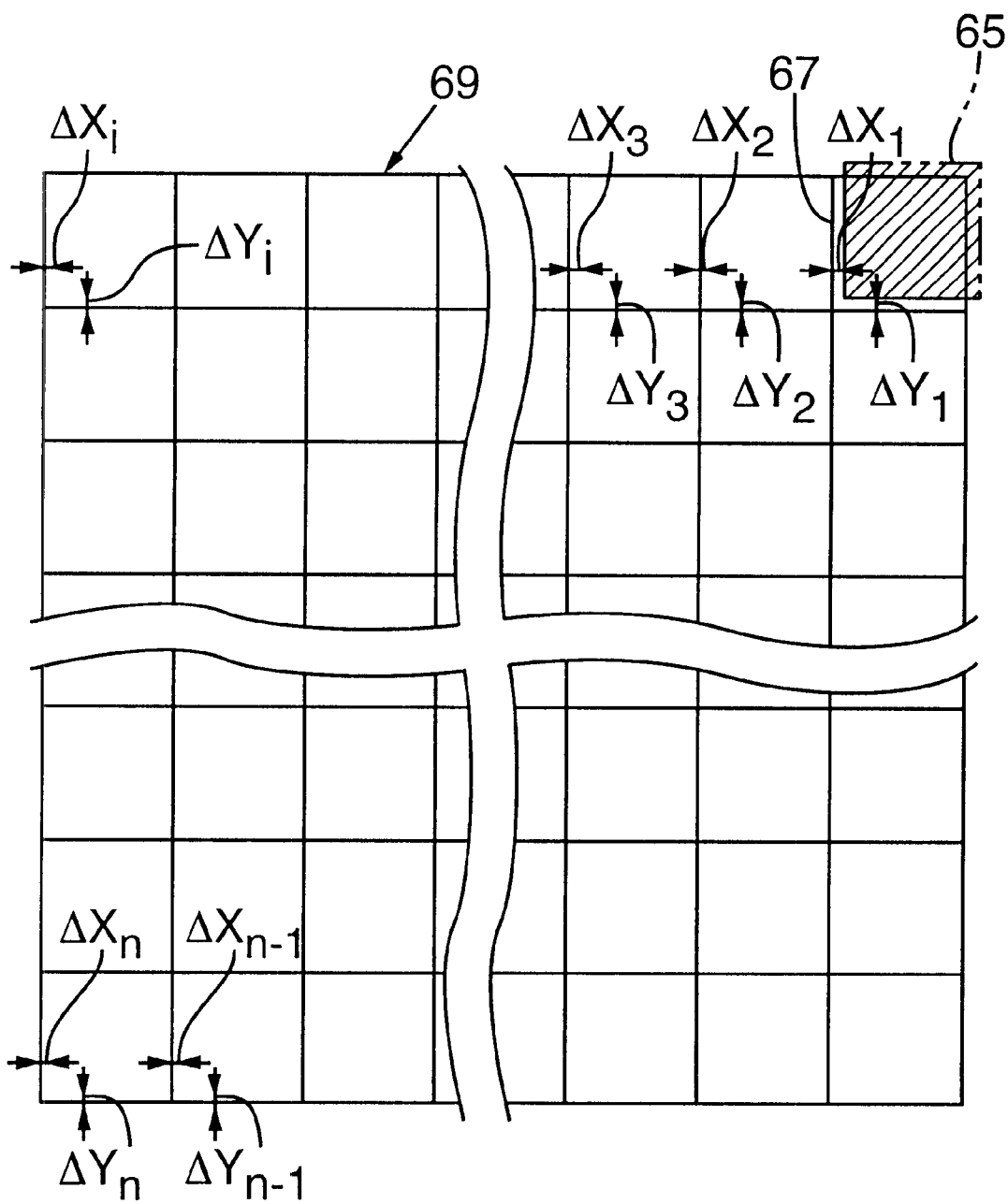
FIG. 3 is a schematic plan view depicting certain aspects of an exemplary statistical processing method, according to the invention, for reducing stage-position-control errors.

In FIG. 3, the respective magnitudes of displacement correction for each subfield in the range 69 are denoted $(\Delta X_1, \Delta Y_1)$, $(\Delta X_2, \Delta Y_2)$, . $(\Delta X_i, \Delta Y_i)$, . . . ,$(\Delta X_n, \Delta Y_n)$.

The respective directions and magnitudes of correction to be performed by the image-positioning deflector 16 for each subfield image desirably are recorded in a memory upon irradiation of each subfield. Upon completing exposure of a specific range of subfields, statistical calculations of the stored correction values are performed for the subfields in the range. For example, the statistical computer 33 calculates the mean of error(s) in each of the X- and Y-directions for all subfields in a stripe (as a representative range). Whenever the next stripe is exposed, the wafer-stage coordinates for each subfield are correspondingly offset in the X- and Y-directions according to the respective calculated average errors.

The equations for the statistical calculations are shown below:

$$X_O = \sum_{i=1}^{n} \Delta X_i / n$$

$$X_i = X_i + X_O$$

Thus, the average value ($X_O$) of errors in the X-direction for a current stripe of the reticle pattern is added as an offset to the controlled stage position for the subsequent stripe of the reticle pattern. i.e., when exposing the subsequent stripe, the stage position is displaced by the amount $X_O$. Such displacement allows any beam deflection to be brought closer to an ideal deflection position so as to minimize deflection aberrations. Similar displacement processing is performed for the Y-direction.

The deflector used for correcting stage-position errors desirably is positioned such that the magnitude of deflection imparted to the beam by the error-correction deflector is as small as possible. Alternatively, respective coordinates for the subfield images can be calculated such that the sum of squares of positional offsets, in each of the X- and Y-directions, of actual from ideal are minimized for all subfields in a specific range (e.g., stripe). The results of such calculations can be used to determine subfield coordinates for the subsequent range (e.g., stripe).

The positional offsets or respective subfield coordinates calculated by the statistical computer are routed to the wafer-stage driver 24a.

When exposing the next specific range of subfields (e.g., subsequent stripe), the positional offsets or respective coordinates of subfield coordinates determined in the previous range are applied. For example, subfield images can be exposed at respective positions according to a coordinate system determined by adding respective offsets for respective subfields, as determined in a previous stripe, to the coordinates of respective subfields in the current stripe. Corrections also may be performed for subfields of smaller ranges than entire stripes. At the same time, other corrections can be made as required such as corrections to subfield-image rotation. Data concerning such corrections can be routed as feedback to the reticle-stage driver or to both the wafer-stage driver and the reticle-stage driver.

An example of a reticle-subfield positional adjustment, including image rotation, is now described for a case in which rotational errors of the subfield images are evident within a defined range. In this example, an ideal stage position has the coordinates $(x_i, y_i)$, and actual measured coordinates are $(X_i, Y_i)$. If the rotational and translational differences of actual from ideal are denoted as $(x_o, y_o)$, then the effective conversions for the coordinates are as follows:

$$\begin{pmatrix} \cos\theta & -\sin\theta \\ \sin\theta & \cos\theta \end{pmatrix} \begin{pmatrix} x_i \\ y_i \end{pmatrix} + \begin{pmatrix} x_O \\ y_O \end{pmatrix}$$

Hence the effective error is:

$$\begin{pmatrix} X_i \\ Y_i \end{pmatrix} - \begin{pmatrix} \cos\theta & -\sin\theta \\ \sin\theta & \cos\theta \end{pmatrix} \begin{pmatrix} x_i \\ y_i \end{pmatrix} - \begin{pmatrix} x_O \\ y_O \end{pmatrix}$$

and the sum W of squares of the effective errors at each point is:

$$W = \sum_{i=1}^{n} [(X_i - x_i\cos\theta + y_i\sin\theta - x_O)^2 + (Y_i - x_i\sin\theta - y_i\cos\theta - y_O)^2]$$

The values of $\theta$ and $(x_o, y_o)$ that minimize the foregoing offsets are the optimum effective shifts.

Hence, from the following three equations:

$$\frac{\partial W}{\partial \theta} = O, \frac{\partial W}{\partial x_O} = O, \frac{\partial W}{\partial y_O} = O$$

the three unknown variables of $\theta$, $x_o$, and $y_o$ are determined.

According to this invention, by statistically processing the magnitude of correction to be imparted to a patterned beam by an image-positioning deflector and by correspondingly reducing the magnitude of corrective deflection, increases in deflection aberrations caused by the corrective deflections can be avoided.

Whereas the invention has been described in connection with a representative embodiment, it will be understood that the invention is not limited to that embodiment. On the contrary, the invention is intended to encompass all modifications, alternatives, and equivalents as may be included within the spirit and scope of the invention, as defined by the appended claims.

What is claimed is:

1. A charged-particle-beam (CPB) microlithography apparatus, comprising:
    (a) an illumination-optical system situated and configured to illuminate a charged-particle illumination beam from a source onto a reticle defining a pattern to be transferred onto a sensitive substrate, the reticle being divided into multiple subfields each defining a respective portion of the pattern and each subfield being individually illuminated by the illumination-optical system for transfer of the respective pattern portion, the illumination beam passing through the illuminated subfield forming a patterned beam propagating downstream of the reticle;
    (b) a reticle stage on which the reticle is movably mounted to allow the illumination-optical system to illuminate a region of the reticle with the illumination beam;
    (c) a reticle-stage position detector;
    (d) a projection-optical system situated and configured to project and focus the patterned beam onto a sensitive substrate, the projection-optical system comprising an image-positioning deflector;
    (e) a substrate stage on which the sensitive substrate is movably mounted to allow the patterned beam, passing through the projection-optical system, to form an image of the illuminated subfield at a respective location on the sensitive substrate;
    (f) a substrate-stage position detector; and
    (g) a controller connected to the illumination-optical system, the projection-optical system, the reticle stage, the reticle-stage position detector, the substrate stage, and the substrate-stage position detector, the controller being configured to (i) controllably operate each of the projection-optical system, the reticle stage, the reticle-stage position detector, the substrate stage, and the substrate-stage position detector, so as to transfer the pattern subfield-by-subfield in a sequential manner from the reticle to the substrate, (ii) controllably energize the image-positioning deflector so as to arrange the images of the subfields contiguously on the substrate, (iii) detect errors in positioning of one or both the reticle stage and substrate stage for exposing an image of a subfield on the substrate, (iv) correct the stage-positioning errors for subfields in a range of subfields by appropriately energizing the image-positioning deflector; (v) in a memory, store data concerning the stage-positioning errors detected in the range, (vi) calculate an error statistic concerning stage-positioning errors detected regarding the subfields in the range, so as to yield data concerning an error trend in the range, and (vii) during exposure of a subsequent range of subfields, recalling the data from the memory and utilizing the recalled data and the data concerning the error trend in a previous range to control positioning of the stages during exposure of the subfields in the subsequent range so as to minimize average errors in stage positioning in the subsequent range.

2. The apparatus of claim 1, wherein the subfields on the reticle are arranged into a plurality of stripes each comprising multiple rows of subfields, each stripe constituting a range.

3. The apparatus of claim 1, wherein the controller directs operation of the image-positioning deflector so as to achieve, in each range, a deflection of the patterned beam sufficient to reduce deflection aberrations compared to deflection aberrations obtained during exposure of subfields in a previous range.

4. The apparatus of claim 1, wherein-the data stored in the memory includes data on image rotation detected for the subfields in the range.

5. The apparatus of claim 1, wherein the statistic is a sum of squares of effective errors detected for the subfields in the range.

6. In a method for performing charged-particle-beam (CPB) microlithography in which a charged-particle illumination beam sequentially irradiates subfields of a segmented pattern-defining reticle, and a patterned beam, formed from the illumination beam passing through an illuminated subfield, is directed to a corresponding location on a sensitive substrate, a method for controlling deflection-induced aberrations of the patterned beam, the method comprising:

mounting the reticle on a reticle stage that moves the reticle as required to allow the illumination beam to illuminate a desired subfield of the reticle;

mounting the substrate on a substrate stage that moves the substrate as required to allow the patterned beam to form an image of the illuminated subfield at a desired location on the substrate;

detecting respective positions of the reticle stage and substrate stage;

providing an image-positioning deflector operable to deflect the patterned beam as required to form the image of the illuminated subfield at a desired location on the substrate;

while transferring the pattern from the reticle to the substrate, detecting errors in positioning of one or both the reticle stage and substrate stage for exposing an image of a subfield on the substrate;

correcting the stage-positioning errors for subfields in a range of subfields by appropriately energizing the image-positioning deflector;

storing data concerning the stage-positioning errors detected in the range;

calculating an error statistic concerning stage-positioning errors detected regarding the subfields in the range, so as to yield data concerning an error trend in the range; and during exposure of a subsequent range of subfields, recalling the data from storage and utilizing the recalled data and the data concerning the error trend in a previous range to control positioning of the stages during exposure of the subfields in the subsequent range so as to minimize average errors in stage positioning in the subsequent range.

* * * * *

UNITED STATES PATENT AND TRADEMARK OFFICE
CERTIFICATE OF CORRECTION

PATENT NO.   : 6,376,848 B1
DATED        : April 23, 2002
INVENTOR(S)  : Hideyuki Minami It is certified that error appears in the above-identified patent and that said Letters Patent is hereby corrected as shown below:

Column 3,
Line 4, "(v7)" should be -- (7) --.

Column 5,
Line 53, "IB" should be -- PB --.

Column 7,
Line 56, "beam." should be -- beam.) --.

Column 9,
Line 10, "C.O," should be -- C.O., --.

Signed and Sealed this

Eleventh Day of February, 2003

JAMES E. ROGAN
*Director of the United States Patent and Trademark Office*